United States Patent
Berkcan et al.

(10) Patent No.: US 7,741,832 B2
(45) Date of Patent: Jun. 22, 2010

(54) MICRO-ELECTROMECHANICAL SYSTEM (MEMS) BASED CURRENT AND MAGNETIC FIELD SENSOR USING TUNNELING CURRENT SENSING

(75) Inventors: Ertugrul Berkcan, Clifton Park, NY (US); Christopher James Kapusta, Delanson, NY (US); Marco Francesco Aimi, Niskayuna, NY (US); Shankar Chandrasekaran, Tamil Nadu (IN); Glenn Scott Claydon, Wynantskill, NY (US)

(73) Assignee: General Electric Company, Niskayuna, NY (US)

( * ) Notice: Subject to any disclaimer, the term of this patent is extended or adjusted under 35 U.S.C. 154(b) by 446 days.

(21) Appl. No.: 11/736,678

(22) Filed: Apr. 18, 2007

(65) Prior Publication Data

US 2007/0181963 A1    Aug. 9, 2007

Related U.S. Application Data

(63) Continuation-in-part of application No. 11/289,910, filed on Nov. 30, 2005, now Pat. No. 7,221,144, which is a continuation-in-part of application No. 11/129,682, filed on May 13, 2005, now Pat. No. 7,315,161, which is a continuation-in-part of application No. 10/863,442, filed on Jun. 7, 2004, now Pat. No. 7,112,951.

(51) Int. Cl.
    *G01R 33/00* (2006.01)
(52) U.S. Cl. .................................. 324/126; 324/117 R
(58) Field of Classification Search ........................ None
    See application file for complete search history.

(56) References Cited

U.S. PATENT DOCUMENTS

| | | | |
|---|---|---|---|
| 5,117,166 A | 5/1992 | Kumar | |
| 5,517,093 A | 5/1996 | Augustyniak et al. | |
| 6,215,318 B1 * | 4/2001 | Schoefthaler et al. | ....... 324/658 |
| 6,348,788 B1 | 2/2002 | Yao et al. | |
| 6,441,581 B1 | 8/2002 | King et al. | |
| 6,486,627 B1 | 11/2002 | Gabrys | |
| 6,591,758 B2 | 7/2003 | Kumar | |
| 6,612,245 B2 | 9/2003 | Kumar et al. | |
| 6,612,246 B2 | 9/2003 | Kumar | |
| 6,664,786 B2 | 12/2003 | Kretschmann et al. | |
| 6,734,660 B1 | 5/2004 | Berkcan et al. | |
| 7,112,951 B2 | 9/2006 | Berkcan et al. | |
| 2002/0021122 A1 | 2/2002 | Yao et al. | |
| 2005/0270013 A1 | 12/2005 | Berkcan et al. | |
| 2005/0270014 A1 | 12/2005 | Zribi et al. | |
| 2006/0076947 A1 | 4/2006 | Berkcan et al. | |
| 2007/0120553 A1 * | 5/2007 | Andarawis et al. | .......... 324/126 |

* cited by examiner

*Primary Examiner*—Minh N Tang
(74) *Attorney, Agent, or Firm*—Richard D. Emery (57) ABSTRACT

A micro-electro-mechanical system (MEMS) current sensor for sensing a magnetic field produced by an electrical current flowing in a conductor includes a first fixed element and a moving element. The moving element is spaced away from the first fixed element and is movable relative to the fixed element responsive to a magnetic field produced by an electrical current flowing in a conductor for providing a mechanical indication of a strength of the magnetic field. The sensor also includes a tunneling current generator for generating a tunneling current between the first fixed element and the moving element and a tunneling current monitor for monitoring a change in the tunneling current responsive to the mechanical indication to provide an indication of a value of the electrical current in the conductor.

25 Claims, 4 Drawing Sheets

MICRO-ELECTROMECHANICAL SYSTEM (MEMS) BASED CURRENT AND MAGNETIC FIELD SENSOR USING TUNNELING CURRENT SENSING

RELATED APPLICATIONS

This Application is a continuation-in-part of Ser. No. 11/289,910 filed on Nov. 30, 2005, now U.S. Pat. No. 7,221,144, entitled "Micro-Electromechanical System (MEMS) based Current and Magnetic Field Sensor Having Improved Sensitivities", which is a continuation-in-part of Ser. No. 11/129,682 filed on May 13, 2005 now U.S. Pat. No. 7,315,161 entitled "MICRO-ELECTROMECHANICAL SYSTEM (MEMS) BASED CURRENT & MAGNETIC FIELD SENSOR HAVING CAPACITIVE SENSE COMPONENTS", which in turn is a continuation-in-part of U.S. patent application Ser. No. 10/863,442, filed on Jun. 7, 2004, issued as U.S. Pat. No. 7,112,951 on Sep. 26, 2006 entitled "MEMS BASED CURRENT SENSOR USING MAGNETIC-TO-MECHANICAL CONVERSION AND REFERENCE COMPONENTS," all of which are hereby fully incorporated by reference.

FIELD OF THE INVENTION

The present disclosure relates generally to electrical current and magnetic field sensing devices. More particularly, the present disclosure relates to a micro-electromechanical system (MEMS) current and magnetic field sensor using tunneling current sensing.

BACKGROUND OF THE INVENTION

It is known that a current carrying conductor produces a magnetic field in the vicinity of the current carrying conductor. It is also known that the magnetic field produced by the current carrying conductor can induce a force with another current carrying conductor disposed in the magnetic field produced by that current carrying conductor. As such, one approach used to sense electrical current involves the use of a sensor that measures the magnetic field induced by current flowing in a current carrying conductor. Since the generated magnetic field is proportional to the current flowing in the current carrying conductor, such a sensor can use the magnitude of the magnetic field to determine the current.

Current sensors that use magnetic fields to measure electrical current are well suited for high voltage applications from a safety perspective because they do not have to contact the high voltage circuitry. However, there are several disadvantages associated with existing current sensors that use magnetic fields to measure electrical current in high voltage applications. In general, existing current sensors tend to have a large form factor because they require a thick conductor that can withstand the varying levels of current flow that may be experienced. This current flow induces heating, which reduces the efficiency of the current sensors and introduces a possible error factor in sensor accuracy. Since existing current sensors are large and bulky, their physical and electrical operating characteristics have up to now prevented their use in smaller scale environments.

BRIEF DESCRIPTION OF THE INVENTION

In one embodiment, there is provided a micro-electromechanical system (MEMS) current sensor for sensing a magnetic field produced by an electrical current flowing in a conductor. The system includes a first fixed element and a moving element spaced away from the first fixed element and movable relative to the fixed element responsive to a magnetic field produced by an electrical current flowing in a conductor for providing a mechanical indication of a strength of the magnetic field. The system also includes a tunneling current generator for generating a tunneling current between the first fixed element and the moving element and a tunneling current monitor for monitoring a change in the tunneling current responsive to the mechanical indication to provide an indication of a value of the electrical current in the conductor.

In another embodiment, there is provided a micro-electromechanical system (MEMS) current sensor for sensing a magnetic field produced by an electrical current flowing in a conductor. The system includes a MEMS-based magnetic field sensing component having a magneto-MEMS component for sensing a magnetic field produced by an electrical current flowing in a conductor and a tunneling current circuit associated with the magneto-MEMS component for providing an indication of the electrical current flowing in the conductor based on the sensed magnetic field.

In another embodiment, there is provided a method for sensing a magnetic field produced by an electrical current flowing in a conductor using a micro-electro-mechanical system (MEMS) current sensor. The method includes generating a tunneling current between a fixed element and a moving element of a MEMS current sensor, wherein the moving element is movable relative to the fixed element responsive to a magnetic field produced by an electrical current flowing in a conductor. The method also includes identifying a change in the tunneling current responsive to movement of the moving element away from a position relative to the fixed element and providing an indication of the strength of the magnetic field responsive to the change in the tunneling current.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
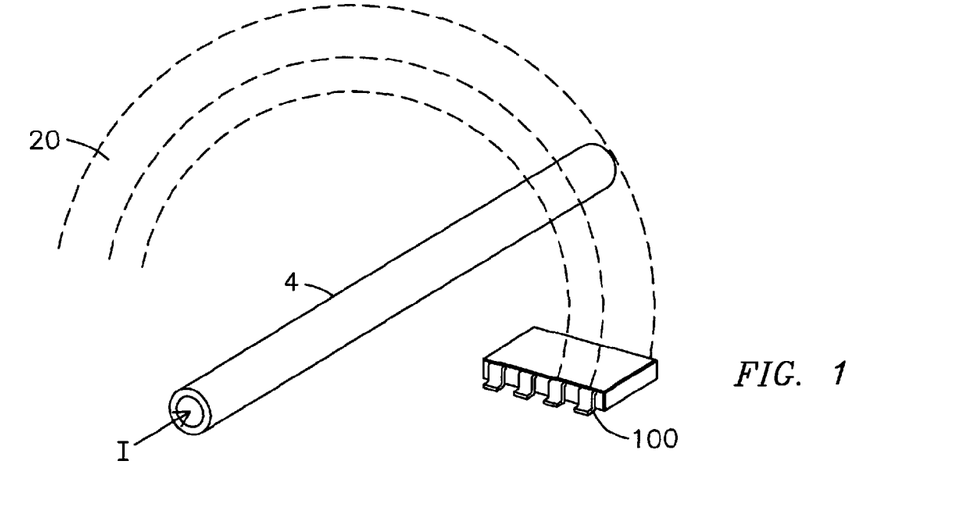
FIG. 1 is a schematic diagram representative of a MEMS-based current and magnetic field sensor constructed in accordance with various embodiments of the invention.

FIG. 1 illustrates one embodiment of a MEMS current and magnetic field sensing device described herein and hereinafter generally referred to as "current sensor 100." As shown, conductor 4 carrying a current I generates a magnetic field 20.

In accordance with one embodiment of the present disclosure, current sensor 100 can be used to sense the current I in a current carrying conductor 4, without having to make physical contact with the current carrying conductor. In accordance with the illustrated embodiment, the MEMS current sensor 100 operates to sense and determine the current I carried by the conductor 4 by making use of a Lorentz force resulting when current sensor 100 is positioned in the magnetic field 20 generated by current I. In one embodiment, the current sensor 100 includes a magnetic field sensing component having a tunneling current based magneto-MEMS component for sensing magnetic fields and for providing, in response thereto, an indication of the current present in the respective conductors to be measured.

The advantageous size of a MEMS-based current and magnetic field sensor, such as current sensor 100 described herein, facilitates the sensing of current in applications where space is limited. Moreover, the use of MEMS-based components provides a current sensor that is highly accurate, reliable, robust, and introduces little to no error to the current being sensed. Due, at least in part, to the non-contact sensing methods described herein for sensing current using MEMS current sensor 100, the MEMS current sensor 100 preferably has no impact on the magnitude and/or direction of the current being sensed. For example, given the dimensions of MEMS-based components and the sensitivity of the same, the MEMS current sensor 100 preferably does not introduce or cause any appreciable variation or change in the current being sensed or measured. Moreover, the MEMS current sensor 100 is advantageous for its reduced cost and significantly reduced size over existing current sensors. Further, due to micro-lithography and micro-fabrication techniques, the fabrication of the MEMS current sensor 100 is advantaged through increased accuracy and precision.

Presently, MEMS generally refer to micron-scale structures that, for example, can integrate a multiplicity of diverse elements, e.g., mechanical elements, electromechanical elements, sensors, actuators, and electronics, on a common substrate through micro-fabrication technology. It is contemplated, however, that many techniques and structures presently available in MEMS devices will in just a few years be available via nanotechnology-based devices, e.g., structures that may be smaller than 100 nanometers in size. Accordingly, even though example embodiments described throughout this document may refer to MEMS-based devices, it is submitted that the inventive aspects of the present invention should be broadly construed and should not be limited to micron-sized devices.

Figure 2:
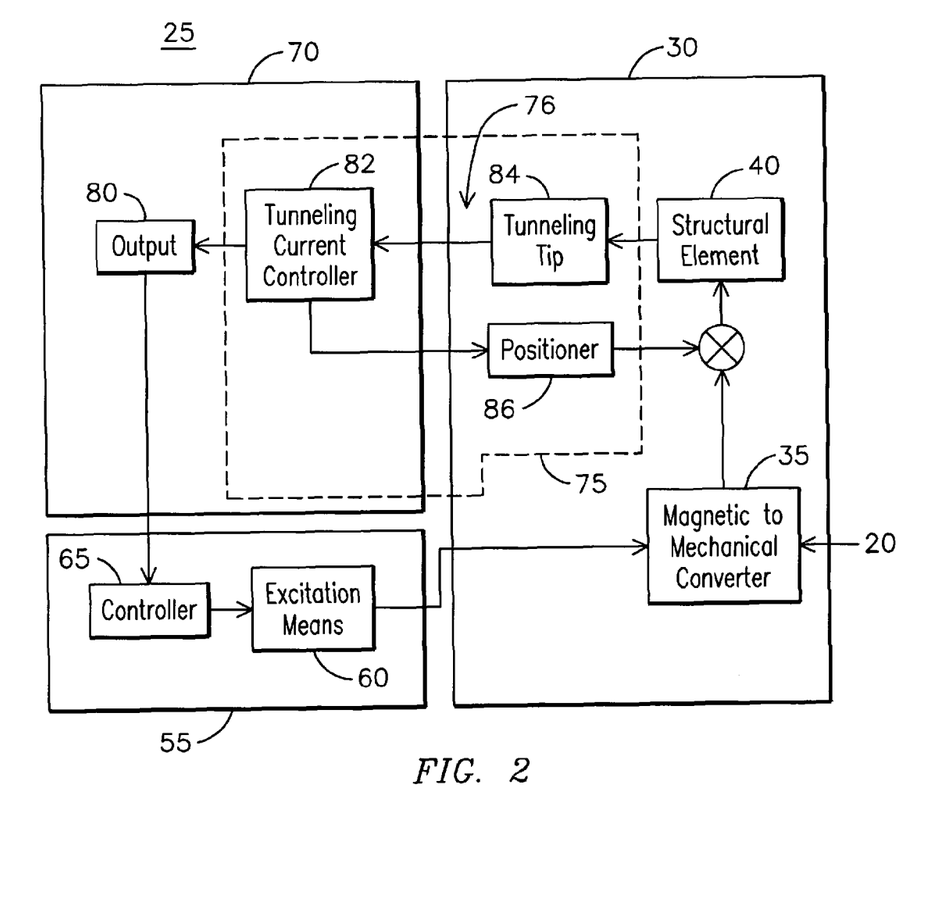
FIG. 2 is a schematic diagram illustrating an example embodiment of a tunneling current-based MEMS current sensor.

FIG. 2 is a schematic diagram illustrating one embodiment of a MEMS-based magnetic field sensing component 25 of MEMS-based current sensor 100. The MEMS-based magnetic field sensing component 25 senses magnetic fields such as magnetic field 20 and provides an indication of the current in a corresponding current carrying conductor, such as conductor 4. The sensed indication of the current may include both a magnitude and a directional component regarding the current being sensed. In one embodiment, the sensed indication of the current is an electrical indication of the current being sensed.

In the illustrated embodiment of FIG. 2, the MEMS-based magnetic field sensing component 25 includes a tunneling current-based magneto-MEMS component 30, an output component 70, and a compensator 55. The tunneling current-based magneto-MEMS component 30 senses a magnetic field and, in response thereto, converts the sensed magnetic field to a mechanical indicator of a corresponding current I. The output component 70 provides an output indicative of the current I in the conductor being measured. In one embodiment, output from the output component 70 may take the form of an electrical signal indicative and representative of the magnitude and sign of the current flowing in the conductor being measured. Output component 70 may interface with a memory, an indicator (e.g., a display screen), and/or another device or apparatus (e.g., a digital signal processor or computer-based analyzer) for further processing.

In the illustrated embodiment, the tunneling current-based magneto-MEMS component 30 includes a magnetic-to-mechanical converter 35 for converting the magnetic representation of the current I to a mechanical change. In one embodiment, the magnetic-to-mechanical converter 35 may be a conductor such as a coil. Additionally, the illustrated tunneling current-based magneto-MEMS component 30 includes a structural component 40 for providing structural support to the tunneling current-based magneto-MEMS component 30. The structural component 40 may represent one or more heterogeneous or homogeneous structures, devices, materials, assemblies, sub-systems, and so forth. For example, in one embodiment, the structural component 40 may represent a first structural component in the form of a first fixed element and a second structural component in the form of a moving element. In one embodiment, the structural component 40 is responsive to the mechanical change provided by the magnetic-to-mechanical converter 35 and provides a mechanical indicator representative of the current I. The mechanical indicator may be representative of movement experienced by the structural component 40 that registers or otherwise indicates the sensing of the magnetic field. In one embodiment, the mechanical indicator may be a displacement of the structural component 40. In one embodiment, the structural component 40 may include one or more of a deflectable membrane, a cantilever, a beam, a diaphragm, a flexure member, a cavity, a surface micro-machined structure, a bulk micro-machined structure, a comb structure, a bridge or any number of other structural devices. Moreover, the mechanical indicator provided by the structural component 40 may convey the vector space value of the mechanical indicator, including one or more of an associated amplitude, direction, speed, and any other characteristic thereof that can be used to convey the vector space value of the mechanical indicator.

In one embodiment, the tunneling current-based magneto-MEMS component 30 includes at least one mechanical change to electrical converter 75 for converting the mechanical indicator provided by structural component 40 into an electrical signal representative of the sensed current I. In one embodiment, the mechanical-to-electrical converter 75 converts the sensed mechanical indicator for interpretation and/or further processing by the output stage 80. In one embodiment, the mechanical-to-electrical converter 75 is based on a tunneling current technique. In particular, the mechanical-to-electrical converter 75 may include a tunneling circuit 76 having a tunneling current controller 82 and a tunneling current element, such as one or more tunneling current focusing structure(s), or tunneling current tip(s) 84. In one embodiment, the tunneling current controller 82 may be configured for establishing, monitoring, and maintaining a tunneling current between a fixed element of the structural component 40 and a moving element displaced responsive to the sensed current I.

In an embodiment, the compensator 55 may be used to establish a bias current in a coil of the magnetic-to-mechanical converter 35 for mechanically indicating strength of a magnetic field. The compensator 55 may also be used compensate for effects due to e.g., mechanical tolerances, aging of the sensor, temperature, environmental factors, etc. The compensator 55 may include an excitation source (such as a current source) 60 and a controller 65. The excitation source 60 may provide excitation quanta (i.e., an amount of excitation energy) for use by the MEMS current sensor 100. The controller 65 may control, for example, a switching and an application of the excitation quanta of the excitation source 60. The controller 65 may be, for example, a switch, an analog processor, a digital signal processor, a digital computing device or an analog-computing device. In the present example, the controller controls at least an on, off, and a value of a bias current supplied to the magnetic-to-mechanical converter 35.

Although the output component 70, the tunneling current-based magneto-MEMS component 30, and the compensator 55 of FIG. 2 appear as separate components, these components and their respective functional blocks can be further combined or further partitioned without departing from the spirit and scope of the disclosure.

Figure 3:
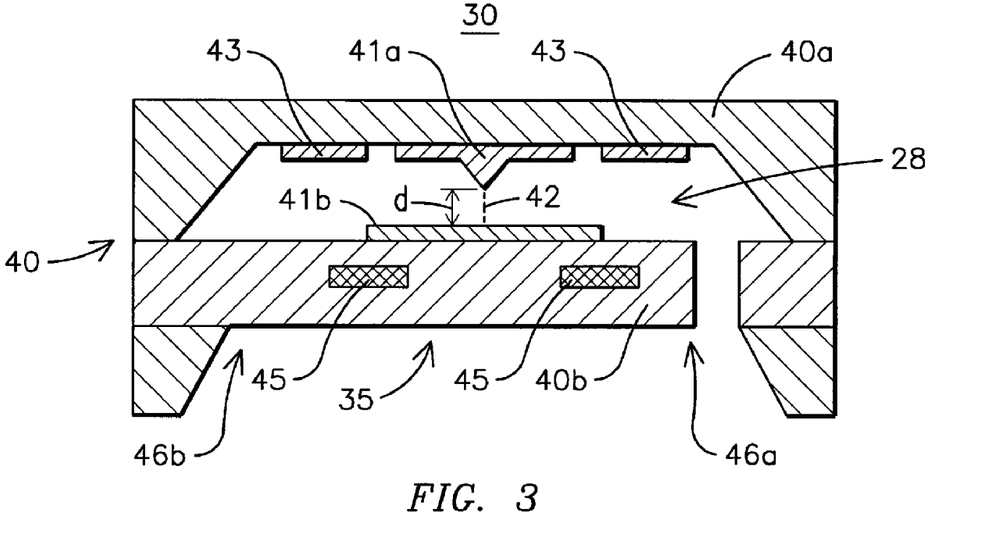
FIG. 3 illustrates a schematic sectional side elevational view of aspects of a tunneling current based magneto-MEMS component.

FIG. 3 illustrates one embodiment of a tunneling current-based magneto-MEMS component. In FIG. 3, tunneling current-based magneto-MEMS component 30 includes structural component 40 shown as a first structural component 40a and a second structural component 40b positioned substantially opposite the first structural component 40a. As shown in FIG. 3, first structural component 40a may be a fixed element, and second structural component 40b may be a moving element spaced away from the first structural component 40a and movable relative to the first structural component 40a. For example, the second structural component 40b may include a cantilever fixed at a supported end 46b and free to move at a free end 46a.

In one embodiment, the second structural component 40b includes a first mechanical sense component 45, such as a conductor coil, responsive to a magnetic field when the coil is energized with an electrical current. The first mechanical sense component 45 may represent an electrically conductive region or material (herein referred to as an "electrode") contained by or coupled to the first mechanical sense component 45. In one embodiment, the first and second structural components 40a and 40b respectively represent first and second substrates. For example, the first mechanical sense component 45 may each represent a layer, region, or trace of conductive material, such as a metal, disposed on or formed within a substrate such as Silicon. In one embodiment, the first structural component 40a represents a substrate having a cavity 28 defined therein.

In another embodiment, the structural components 40a, 40b include respective first and second tunneling current circuit elements 41a and 41b. The tunneling current circuit elements 41a and 41b may represent electrodes contained by or coupled to the first and second structural components 40a, 40b, respectively. The first tunneling current circuit element 41a may be configured as a tunneling current focusing structure, such as tunneling current tip, for sensing a tunneling current 42 established between the first tunneling current circuit element 41a and the second tunneling current circuit element 41b. The first structural element 40a may also include a positioning element 43, such as an electrode contained by or coupled to the first structural component 40a. The positioning element 43, may be operated in conjunction with the first mechanical sense component 45, and may be configured for controlling a separation distance d between the first and second structural elements.

Figure 4:
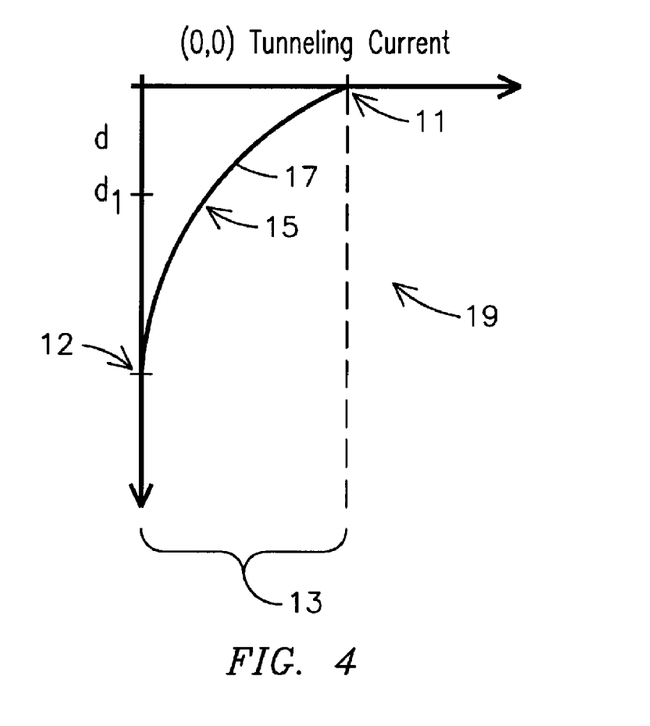
FIG. 4 is an example graph of tunneling current versus separation distance illustrating an exponential variation of tunneling current with separation distance.

In accordance with one embodiment, during operation of the tunneling current-based magneto-MEMS component 30, a voltage differential may be applied across the first component 40a and second structural component 40b causing a tunneling current 42 to develop between tunneling current circuit elements 41a and 41b. Because a value of the tunneling current 42 between the tunneling current circuit elements 41a and 41b is a function of a distance d between the tunneling current circuit elements 41a and 41b, a change in distance d will produce a corresponding change in the tunneling current 42, such as a change in a value of the tunneling current 42. FIG. 4 illustrates an exemplary graph 19 showing how a value of the tunneling current 42 may vary according to increasing distance d between tunneling current circuit elements 41a and 41b. Point 11 on the graph 19 indicates an ohmic conduction state when d=0, for example, when the tunneling current circuit elements 41a and 41b are in contact. Point 12 on the graph 19 indicates an open circuit state when d is sufficiently large so that no tunneling current exists between tunneling current circuit elements 41a and 41b. In between points 11 and 12, the curve 17 represents an exponential-type variation of tunneling current during a tunneling current phase 13. Accordingly, a distance d between tunneling current circuit elements 41a and 41b may be determined based on a sensed value of the tunneling current in the tunneling phase.

Returning to the illustrated embodiment of FIG. 3, the magnetic-to-mechanical converter 35, comprising first mechanical sense component 45, may be coupled to the second structural component 40a such that when the tunneling current-based magneto-MEMS component 30 is placed in the vicinity of an external current carrying conductor, and a small bias current is flowed in the first mechanical sense component 45 of the magnetic-to-mechanical converter 35, the magnetic field generated by the external conductor will exert a force (e.g., Lorentz force) on the magnetic-to-mechanical converter 35. The bias current used may be in the range of microamps (uA) or milliamps (mA), however a typical bias current might be 1-10 mA. Moreover, a DC or AC bias current may be used without modification to the tunneling current-based magneto-MEMS component 30. Moreover, by driving an AC bias current at frequency that coincides with a resonant frequency of the device, it is possible to further increase sensitivity of the device.

The Lorentz force will cause the second structural component 40b (e.g. moving element) to deflect at the free end 46a about a supported end 46b, such as toward or away from the first structural component 40a in a direction essentially perpendicular to a plane of the first structural element 40a accordingly to a direction of the magnetic field. An amplitude and direction of the deflection experienced by the second element is proportional to current I (see FIG. 1) and its polarity. Therefore, the current I flowing in the current conductor may be sensed based on a degree of deflection generated in the second structural component 40b. The resulting deflection increases or decreases the distance d, and in turn changes a value of the tunneling current 42, for example, according to the tunneling curve 17 of FIG. 4. By sensing a value of the tunneling current 42, the distance d may be determined.

While discussed primarily in the context of using the Lorentz force, the magnetic-to-mechanical converter 35 may be modified to use mutual inductance, a moving loop and/or a magnetic field generated by an external current carrying conductor. Additionally, other characteristic relationships may be used to derive a mechanical indicator of the mechanical indicator corresponding to the current being sensed.

In an embodiment, positioning element 43, such as a current conducting electrode formed as a coil generating a Lorentz force, may be used to obtain a force balance or an equilibrium condition and/or to perform active sensing or zero balance sensing. For example, a distance d may be regulated using positioning element 43 to maintain a desired tunneling current value, such as a reference current value, (for example, point 15 on curve 17 of FIG. 4) between tunneling current circuit elements 41a and 41b. In an example embodiment, point 15 on curve 17 of FIG. 4 may be selected as a reference current value corresponding to a reference distance. A force, such as an electrostatic force or a magnetic force, acting to deflect the second structural element 40b away from the reference distance may be nulled by forcing the second structural element 40b back to distance $d_1$ between tunneling current circuit elements 41a and 41b. A measure of a restorative force required to move the deflected second structural element 40b back to the reference distance may be interpreted to indicate a value of the current flowing in a conductor generating the Lorentz force causing the deflection. The restorative force may be generated by controlling an electric current in the positioning element 43 for generating a magnetic field producing a desired restorative Lorentz force on the magnetic-to-mechanical converter 35 sufficient to return the deflected second structural element 40b back to the reference distance.

Figure 5:
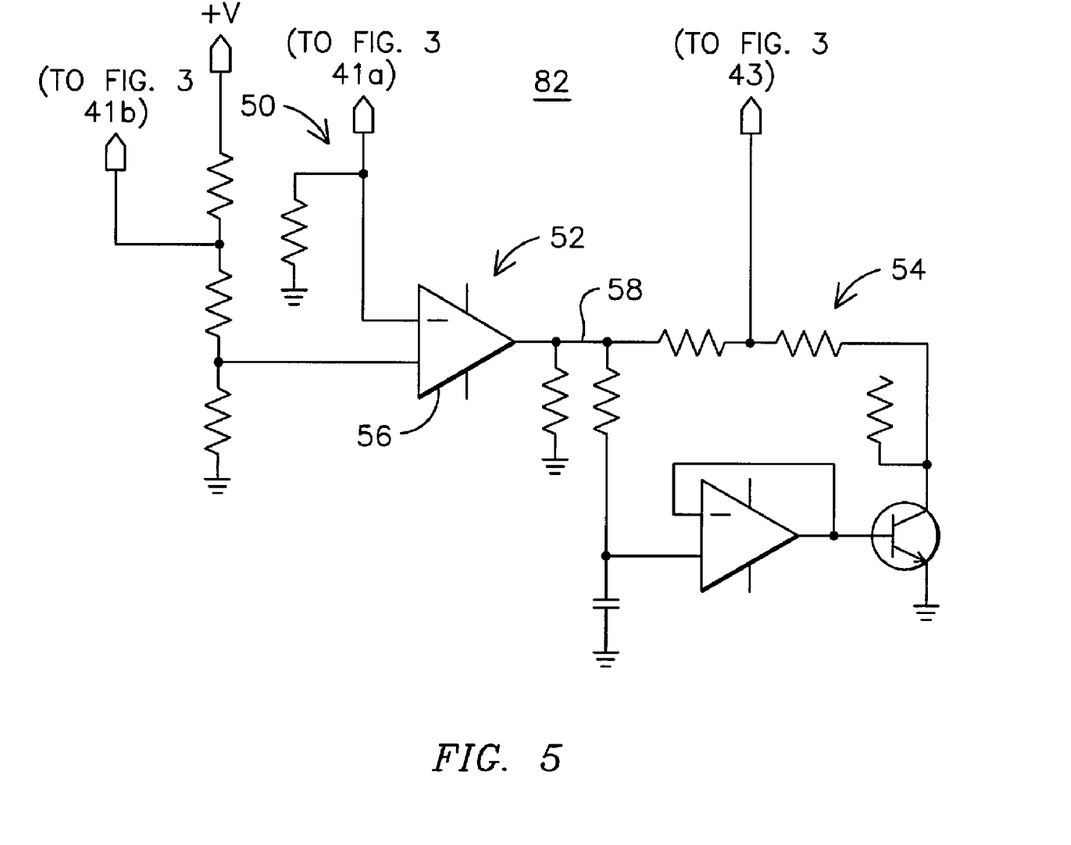
FIG. 5 is a circuit schematic diagram of a tunneling current controller.

FIG. 5 is schematic diagram of an example tunneling current controller 82. The tunneling current controller 82 may include a tunneling current generator 50 configured for generating a tunneling current used for monitoring distance d between tunneling current circuit elements 41a and 41b of FIG. 3. For example, the tunneling current generator 50 may be configured for establishing a voltage between elements 41b and 41a capable of generating a tunneling current therebetween. The tunneling current controller 82 may also include a tunneling circuit monitor 52 for monitoring the generated tunneling current. For example, the tunneling circuit monitor 52 may include a comparator 56 for comparing the respective voltages at the tunneling current circuit elements 41b and 41a. Based on a comparison between the voltages at tunneling current circuit elements 41b and 41a, the comparator 56 may generate a positioning signal 58 for driving the positioning element 43 to position the second structural element 40b with respect to the first structural element 40a to maintain a desired tunneling current between tunneling current circuit elements 41b and 41a. Power for driving the psitioning element 43 based on the positioning signal 58 may be provided by driver circuit 54.

Figure 6:
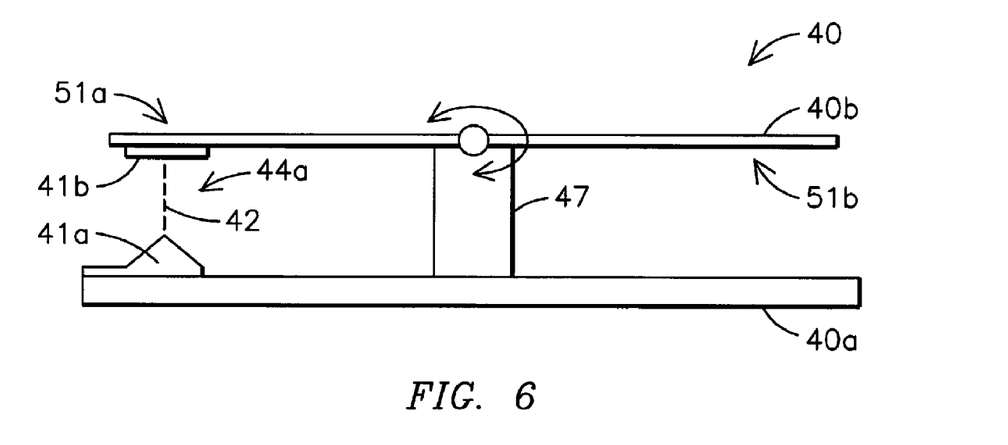
FIGS. 6-9 show example embodiments of tunneling current-based magneto-MEMS components wherein a moving element of the component is configured as beam rotatable about an axis.

FIGS. 6-9 show example embodiments of tunneling current-based magneto-MEMS components 40 wherein the second structural component 40b is configured as beam configured for at least one of flexion and rotation about an axis of rotation member 47, for example, coupled to the first structural element 40a. FIG. 6 shows an example rotating beam embodiment having the second tunneling current circuit element 41 b, such as an electrode, disposed on a portion of the second structural element 40b proximate a first end 51a of the second structural element 40b and facing the first tunneling current circuit element 41a. The first tunneling current circuit element 41a may be disposed on a portion of the first structural element 40a opposite the second tunneling current circuit element 41b. In an example embodiment, the first tunneling current circuit element 41a may be configured as a tunneling current tip to form a tunneling tip/electrode pair for establishing and monitoring a tunneling current 42 therebetween.

Figure 7:
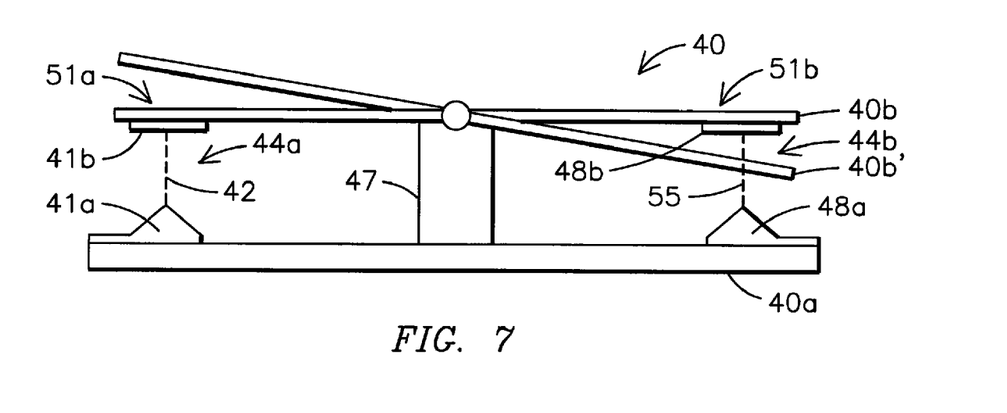

As shown in FIG. 7, a second tunneling current circuit pair, such as a tunneling tip/electrode pair 44b, may be disposed proximate a second end 51 b of the second structural element 40b so that the second tunneling tip/electrode pair 44b is configured in a counterbalancing relationship with respect to the first tunneling tip/electrode pair 44a. For example, a third tunneling current circuit element 48a, such as a tunneling tip, may be disposed on a portion of the first structural element 40a opposite a fourth tunneling current circuit element 48b, such as an electrode, disposed on a portion of the second structural element 40b at a second end 51b to form a tunneling tip/electrode pair 44a for establishing and monitoring a tunneling current 55 therebetween. Respective tunneling currents 42, 55 formed between the pairs, such as a ratio of tunneling currents 42, 55, may be used to determine a deflection of the second structural element 40b about the axis of rotation member 47 as indicated by position 40b'.

Figure 8:
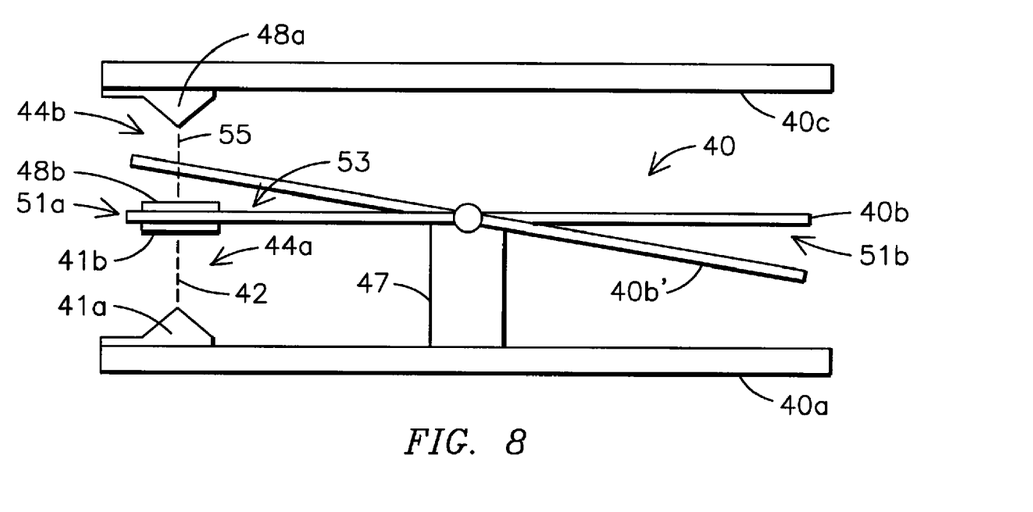

As shown in the example embodiment of FIG. 8, a third structural element 40c spaced away from a side 53 of the second structural element 40b opposite from the first structural element 40a may be added to provide for the second tunneling current circuit pair, such as the second tunneling tip/electrode pair 44b. The second tunneling tip/electrode pair 44b may be configured in a counterbalancing relationship with respect to the first tunneling tip/electrode pair 44a. The second tunneling tip/electrode pair 44b may be disposed at the first end 51a of the second structural element 40b on the side 53 opposite from the first structural element 40a. For example, the third tunneling current circuit element 48a, such as a tunneling tip, may be disposed on the third structural element 40c opposite a forth tunneling current circuit element 48b to form a tunneling tip/electrode pair 44b for establishing and monitoring a tunneling current 55 therebetween. Respective tunneling currents 42, 55 formed between the pairs 44a, 44b may be used to determine, such as by using an exclusive or of the tunneling currents 42, 55, a deflection of the second structural element 40b about the axis of rotation member 47 as indicated by position 40b'.

Figure 9:
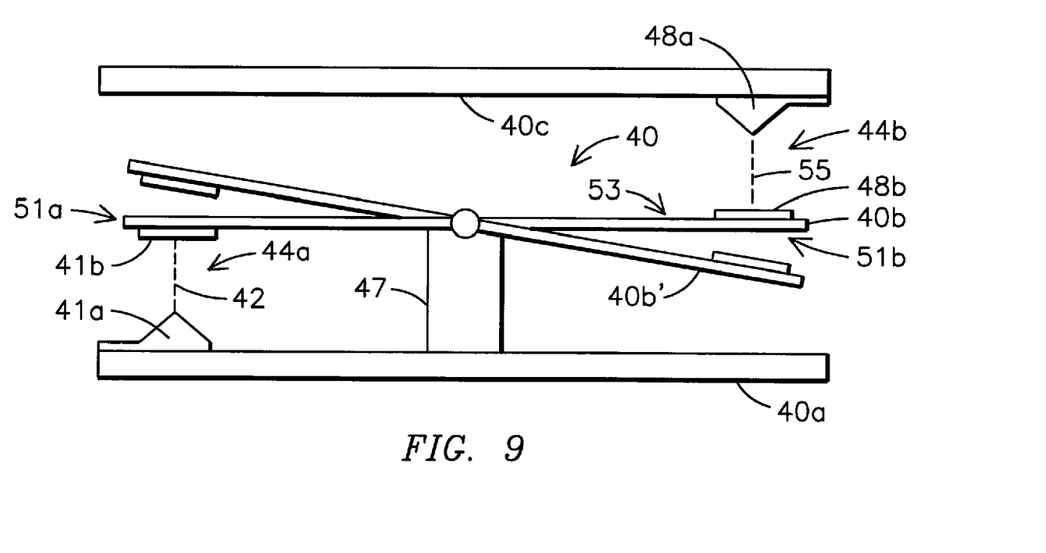

FIG. 9 shows another example embodiment wherein the second tunneling current circuit pair, such as the second tunneling tip/electrode pair 44b, is disposed at the second end 51 b of the second structural element 40b on the side 53 of the second structural element 40b opposite from the first structural element 40a. For example, the third tunneling current circuit element 48a, such as a tunneling tip, may be disposed on the second structural element 40c opposite the forth tunneling current circuit element 48b at the second end 51b to form the tunneling tip/electrode pair 44b for establishing and monitoring a tunneling current 55 therebetween. Respective tunneling currents 42, 55 formed between the pairs 44a, 44b may be used to determine, such as by using a sum of the tunneling currents 42, 55, a deflection of the second structural element 40b about the axis of rotation member 47 as indicated by position 40b'.

Due to batch manufacturing techniques of micro-machining and the associated cost efficiencies, the MEMS-based current sensor 100 as described herein can be manufactured in large batches using for example, photolithography and etching. As noted above, the MEMS device of FIG. 2 is but one example of a current sensor contemplated in accordance with the present disclosure. Other embodiments of the MEMS-based current sensor 100 may include the use of multiple MEMS devices in the current sensor for the purpose of, for example, magnetic field shaping, magnetic field sensing, current value indicating, and other purposes.

While certain embodiments of the present invention have been shown and described herein, such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An apparatus comprising:
   a first fixed element;
   a moving element spaced away from the first fixed element and movable relative to the fixed element responsive to a magnetic field produced by an electrical current flowing in a conductor for providing a mechanical indication of a strength of the magnetic field;
   a tunneling current generator configured to generate a tunneling current between the first fixed element and the moving element; and
   a tunneling current monitor configured to monitor a change in the tunneling current responsive to the mechanical indication to provide an indication of a value of the electrical current in the conductor.

2. The apparatus of claim 1, wherein the tunneling current generator comprises:
   a first tunneling electrode disposed on a first portion of one of the first fixed element and the moving element; and
   a first tunneling current element disposed on a second portion of an opposite one of the first fixed element and the moving element proximate the first tunneling electrode.

3. The apparatus of claim 2, wherein the first tunneling current element comprises a tunneling tip.

4. The apparatus of claim 2, wherein the first tunneling electrode is disposed on the moving element and the first tunneling current element is disposed on the first fixed element.

5. The apparatus of claim 2, further comprising:
   a second tunneling electrode disposed on a third portion of one of the first fixed element and the moving element; and
   a second tunneling current element disposed on a fourth portion of an opposite one of the first fixed element and the moving element proximate the second tunneling electrode, wherein the second tunneling electrode and the second tunneling current element are configured in a counterbalancing relationship with respect to the first tunneling electrode and the first tunneling current element.

6. The apparatus of claim 2, further comprising a second fixed element spaced away from a side of the moving element opposite from the first fixed element.

7. The apparatus of claim 6, further comprising:
   a second tunneling electrode disposed on a third portion of one of the second fixed element and the moving element; and
   a second tunneling current element disposed on a fourth portion of an opposite one of the second fixed element and the moving element proximate the second tunneling electrode, wherein the second tunneling electrode and the second tunneling current element are configured in a counterbalancing relationship with respect to the first tunneling electrode and the first tunneling current element.

8. The apparatus of claim 1, further comprising a positioner in communication with the tunneling current monitor for positioning the moving element responsive to the change in the tunneling current to maintain a desired value of the tunneling current.

9. The apparatus of claim 8, wherein the positioner comprises a positioning electrode disposed on the first fixed element.

10. The apparatus of claim 8, wherein the positioner is configured for generating a force acting on the moving element to position the moving element to maintain the desired value of the tunneling current.

11. The apparatus of claim 10, wherein the force generated by the positioner comprises at least one of an electrostatic force and a magnetic force.

12. The apparatus of claim 1, wherein the movable element comprises at least one of a beam, a cantilever, a deflectable membrane, a diaphragm and a flexure member.

13. The apparatus of claim 12, wherein the beam is configured for at least one of flexion and rotation about a point between a first end and a second end of the beam.

14. The apparatus of claim 13, wherein the tunneling current generator comprises:
   a first electrode disposed on the beam proximate the first end of the beam facing the first fixed element; and
   a first tunneling tip disposed opposite the first electrode on the first fixed element.

15. The apparatus of claim 14, further comprising:
   a second electrode disposed on the beam proximate the second end of the beam and facing the first fixed element; and
   a second tunneling tip disposed opposite the second electrode on the first fixed element.

16. The apparatus of claim 14, further comprising a second fixed element spaced away from a side of the beam opposite from the first fixed element.

17. The apparatus of claim 16, further comprising:
   a second electrode disposed on the beam proximate the first end of the beam and facing the second fixed element; and
   a second tunneling tip disposed opposite the second electrode on the second fixed element.

18. The apparatus of claim 16, further comprising:
   a second electrode disposed on the beam proximate the second end of the beam and facing the second fixed element; and
   a second tunneling tip disposed opposite the second electrode on the second fixed element.

19. An apparatus comprising:
   a micro-electro-mechanical system (MEMS)-based magnetic field sensing component having a magneto-MEMS component configured to sense a magnetic field produced by an electrical current flowing in a conductor;
   a tunneling current circuit associated with the magneto-MEMS component and configured to provide an indication of the electrical current flowing in the conductor based on the sensed magnetic field, wherein the tunneling current circuit comprises a tunneling current generator configured to generate a tunneling current between a fixed element and a moving element; and
   a magnetic-to-mechanical converter coupled to the moving element.

20. The apparatus of claim 19, wherein the moving element is spaced away from the fixed element and movable relative to the fixed element responsive to the magnetic field produced by the electrical current flowing in the conductor, wherein the magnetic field is sensed based at least in part upon a change in a tunneling current defined between the fixed element and the moving element.

21. The apparatus of claim 20, wherein the magnetic-to-mechanical converter is coupled to the moving element such that the magnetic-to-mechanical converter exerts a force on the moving element to generate a measurable displacement of the moving element when exposed to said magnetic field.

22. The apparatus of claim 20, wherein the tunneling circuit comprises a tunneling current monitor configured to monitor the change in the tunneling current responsive to the measurable displacement of the moving element to provide an indication of the electrical current in the conductor.

23. A method comprising:

generating a tunneling current between a fixed element and a moving element of a MEMS current sensor, wherein the moving element is movable relative to the fixed element responsive to a magnetic field produced by an electrical current flowing in a conductor;

identifying a change in the tunneling current responsive to movement of the moving element away from a position relative to the fixed element; and providing an indication of a strength of the magnetic field responsive to the change in the tunneling current.

24. The method of claim 23, further comprising generating a force for acting on the moving element to return the moving element to the position.

25. The method of claim 24, wherein the providing an indication of a strength of the magnetic field responsive to the change in the tunneling current includes providing an indication of a strength of the magnetic field based on an amount of the force sufficient to return the moving element to the position.

* * * * *